United States Patent [19]

Miller et al.

[11] Patent Number: 4,458,209

[45] Date of Patent: Jul. 3, 1984

[54] ADAPTIVE POWER CONTROL CIRCUIT

[75] Inventors: Gene D. Miller, Arlington Heights, James E. Mitzloff, Carpentersville, Peter A. Kwitkowski, Elgin, all of Ill.

[73] Assignee: Motorola, Inc., Schaumburg, Ill.

[21] Appl. No.: 230,965

[22] Filed: Feb. 3, 1981

[51] Int. Cl.³ .............................................. H03G 3/30
[52] U.S. Cl. ................... 330/141; 330/204; 330/281; 330/296
[58] Field of Search .............. 330/199, 202, 204, 141, 330/281, 296, 297; 455/116, 127

[56] References Cited

U.S. PATENT DOCUMENTS 4,317,083  2/1982  Boyd ............................... 455/127 X Primary Examiner—James B. Mullins
Attorney, Agent, or Firm—F. John Motsinger; James W. Gillman; Ed Roney

[57] ABSTRACT

A transmitter power control circuit which provides normal power control functions, and provides a high speed loop response when abrupt changes in output power are required. The circuit utilizes an electronic switch to provide adaptive filtering to permit narrow bandwidth filtering during normal steady state operation of the transmitter and wide bandwidth filtering during desired abrupt changes in transmitter power output. This allows rapid changes in transmitter output power when desired, while substantially eliminating undesired noise during normal operation.

11 Claims, 2 Drawing Figures

ADAPTIVE POWER CONTROL CIRCUIT

A. FIELD OF THE INVENTION

This invention relates generally to amplifier power control circuits and more particularly to an adaptive power control circuit which provides high speed response for abrupt changes in output power and slow speed response for constant power conditions.

B. DESCRIPTION OF THE PRIOR ART

Amplifier control circuits are widely employed in the communications art to provide protection for power output circuitry as well as maintain substantially constant the level of output power. A typical prior art circuit senses the output power of a transmitter and generates a signal representative of the output power. This signal must be filtered to eliminate short term transients and noise, such as alternator whine. The filtered signal is then compared to a reference level in a comparator and the comparator output is utilized to control the transmitter power output. The loop dynamics of this system is directly determined by the filter network. However, for situations in which it is desirable to abruptly change the power level, such as when transmitter power is first initially keyed up or when VSWR protection is required, the filtering required for normal operation results in loop dynamics that are too slow to provide adequate response. This can be critical in some communications systems, such as trunked radio networks.

SUMMARY OF THE INVENTION

Accordingly, it is an object of this invention to provide an adaptive power control circuit for a transmitter amplifier which provides slow speed response for constant power conditions and high speed response for desired abrupt power changes.

It is a further object of this invention to provide an adaptive power control circuit for a transmitter amplifier which is particularly adapted for mobile operation in a trunked communication system.

In practicing the invention, a protection circuit is provided for controlling a transmitter amplifier which produces an RF output varying in response to a control signal applied thereto. The power control circuit includes sensing means coupled to the transmitter amplifier, for sensing RF power and for generating a power signal representative of RF power. A signal processing circuit is coupled to the sensing means for filtering the power signal such that wide bandwidth filtering is utilized in response to a desired change in transmitter amplifier power, for a period of time sufficient to permit the change in transmitter amplifier power and such that narrow bandwidth filtering is otherwise utilized. In addition, a comparator is coupled to the signal processing circuit, for generating a control signal which varies in accordance with the difference between a reference voltage and filtered power signal.

The comparator is coupled to the transmitter amplifier for applying the control signal to the transmitter amplifer to vary the RF power developed by the transmitter.

BRIEF DESCRIPTION OF THE DRAWINGS

The features of the present invention which are believed to be novel are set forth with particularity in the appended claims. The invention itself together with further objects, features and advantages thereof, may best be understood by reference to the following description when taken in conjunction with the accompanying drawings.

DETAILED DESCRIPTION OF THE PREFERRED EMBODIMENT

Figure 1:
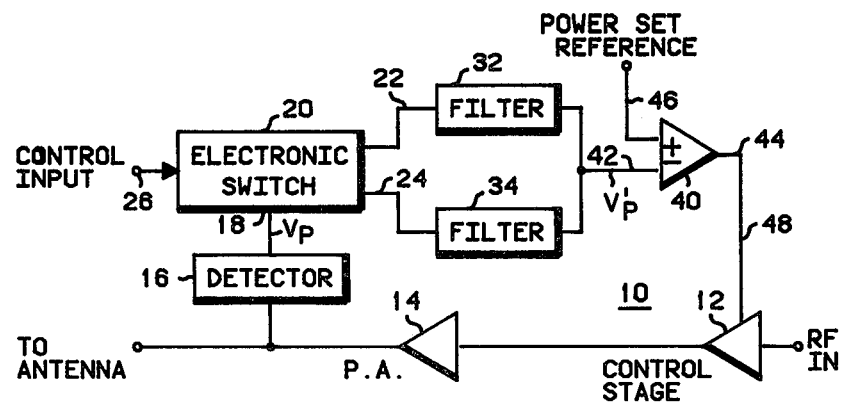
FIG. 1 is a generalized block diagram of the novel protection circuit according to the invention.

Referring to FIG. 1, there is shown a generalized block diagram of a protection circuit 10 according to the invention. Modulated RF signals are coupled to a transmitter amplifier made up of a control stage 12 and a power amplifier stage 14, where they are amplified to the desired RF power level and coupled to an antenna (not shown). In addition, the RF output of the power amplifer stage 14 is coupled to a detector circuit 16.

The power developed by the power amplifier 14 is sensed by the detector circuit 16, (such as a directional coupler) which develops a power signal $V_p$, representative of the RF power level. The power signal $V_p$ is coupled from the detector circuit 16 to an input 18 of an electronic switch 20. The electronic switch couples the power signal $V_p$ to one of its two outputs 22, 24. The control signal applied to a control input 26 switches the applied power signal $V_p$ to one of the two outputs 22, 24. Coupled to the electronic switch output 22 is a first low-pass filter 32, and coupled to the output 24 is a second low-pass filter 34. The first low-pass filter 32 is chosen to have a lower cut off frequency (i.e. narrower bandwidth) than the second low-pass filter 34. The output of each filter 32, 34 is coupled as shown to the inverting input 42 of a comparator stage 40. The comparator stage 40 comprises a differential amplifier or operational amplifier with appropriate feedback (not shown). A power set reference voltage is coupled to the non-inverting input 46 of the comparator stage 40. The comparator stage 40 continuously compares the filtered power signal $V'_p$ to the reference voltage and develops a control signal proportional to the difference between the reference voltage and the filtered power signal $V'_p$ at the output 44. The control signal at the output 44 is coupled to the control stage 12 via a conductor 48, thereby controlling the power output of the transmitter amplifier made up of the control stage 12, and the power amplifier stage 14. Since the control signal output of the comparator stage 40 is proportional to the difference between the power set reference voltage and the filtered power signal $V'_p$, any change in the output power results in a change in the control signal which returns the output power to its desired value. As an example, if the output power drops due to a drop in the supply voltage, the power signal $V_p$ will drop in value. This will result in an increase in the difference between the filtered power signal $V'_p$ and the power set reference voltage, causing the control signal to increase in voltage. The increased control signal voltage will cause the transmitter control stage 12 to increase the power output to its original value. Thus, the circuit provides power levelling by automatically adjusting the control line voltage so that the filtered power signal $V'_p$ is approximately equal to the power set reference voltage. In the preferred embodiment, the power set reference voltage is adjustable, thereby permitting the output power to be adjustable.

To eliminate noise it is necessary to low-pass filter the power signal $V_p$ before applying it to the comparator stage 40. A relatively narrow bandwidth filter is required to eliminate such noise as alternator whine in a mobile transmitter. This narrow bandwidth filtering, however, limits the rate at which a power control circuit can respond to an abrupt change in power level, such as occurs when keying up the transmitter. Therefore, two low-pass filters are provided. The low-pass filter 32 is a narrow bandwidth filter through which the power signal $V_p$ is filtered during normal operations to provide adequate noise filtering. During periods requiring abrupt power changes a signal is applied to a control input 26 of the electronic switch 20 causing the electronic switch 20 to couple the power signal $V_p$ through the filter 34, which is a wide bandwidth filter, thus permitting a rapid change in power level. After a period of time sufficient to allow the transmitter to reach the new power level, the power signal $V_p$ is switched back to the narrow bandwidth filter 32 for normal operation. For example, when the transmitter is keyed up, a signal applied to the control input 26 of the electronic switch 20 causes the electronic switch to couple the power signal $V_p$ from the input 18 to wide bandwidth filter 34 for a time period sufficient to allow the transmitter to reach full power. After the initial time period, a signal applied to the control input 26 causes the electronic switch to couple the power signal $V_p$ to the narrow bandwidth filter 32 until another abrupt power level change is required. Thus, this novel protection circuit 10 permits abrupt changes in power output while still providing adequate noise filtering during normal steady state operation. This rapid power level change capability is necessary in some systems such as trunked communications networks.

Figure 2:
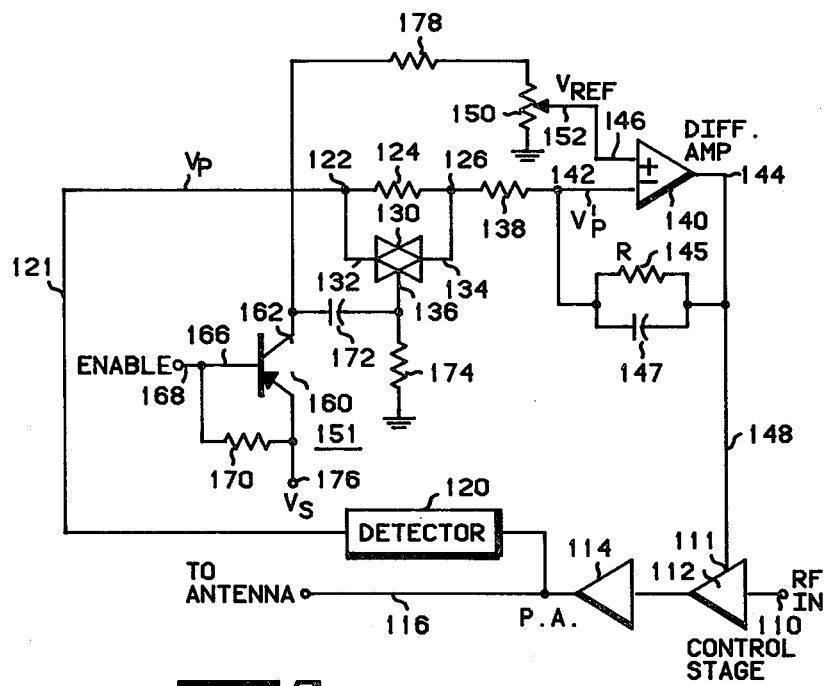
FIG. 2 is a detailed schematic of a preferred embodiment of the novel protection circuit according to the invention.

Referring now to FIG. 2, there is shown a detailed schematic diagram of the preferred embodiment of the novel protection circuit constructed according to the invention. Modulated RF signals are applied to an input terminal 110 and coupled to an RF control amplifer 112. The amplified signals are then coupled to an RF power amplifier 114 and the resulting output signal is coupled to an antenna (not shown) via a conductor 116. An RF detector circuit 120 is coupled as shown to the conductor 116. A power signal $V_p$ is generated by the RF detector 120 and coupled to a node 122 via a conductor 121. A filter resistor 124 is coupled from the node 122 to a node 126, and a transmission gate 130 (e.g. a Motorola MC14016) has an input 132 also coupled to the node 122 and an output 134 coupled to the node 126, as shown. The transmission gate 130 can be switched to short out the filter resistor 124 by means of a signal applied to a control input 136. Thus, the power signal $V_p$ is coupled through the filter resistor 124 or through the transmission gate 130, as desired, to the node 126. This power signal is then coupled through a second filter resistor 138 from the node 126 to the inverting input 142 of a differential amplifier 140. A resistor 145 and a capacitor 147 provide feedback from the output 144 of the differential amplifier 140 to the inverting input 142. The differential amplifier 140, together with the resistor 145 and the capacitor 147, form a comparator circuit. An adjustable reference voltage $V_{REF}$ is coupled from the wiper 152 of an adjustable resistor 150 to the non-inverting input 146 of the differential amplifier 140, as shown. Thus, the comparator circuit composed primarily of the differential amplifier 140 continually compares the filtered power signal to the reference voltage $V_{REF}$ and generates at the output 144 a control signal proportional to the difference between the reference voltage $V_{REF}$ and the filtered power signal. This control signal is coupled via a conductor 148 to the control input 111 of the control stage 112. Since the control voltage is proportional to the difference between the reference voltage $V_{REF}$ and the filtered power signal, a change in transmitter output power results in an opposite change in the control line voltage. This returns the output power to its original value. Thus, power levelling is provided by changing the control line voltage to keep the filtered power signal approximately equal to the reference voltage $V_{REF}$.

During normal operation narrow bandwidth filtering of the power signal $V_p$ is required before it is coupled to the differential amplifier 140. This filtering is provided by the feedback network composed of resistors 145 and capacitor 147, together with the filter resistance provided by the series resistance of resistor 124 and resistor 138. However, during periods of abrupt change in transmitter power, a wide bandwidth filter is provided for a predetermined time period by shorting the filter resistor 124 so that the filter resistance is only that of the filter resistor 138. Thus, for abrupt changes in power, a signal is applied to the control input 136 of the transmission gate 130 to short out for a predetermined period of time the resistor 124. This signal applied to the control input 136 of the transmission gate 130 is generated by a timing circuit 151.

Timing circuit 151 is composed of a transistor 160, a bias resistor 170, a capacitor 172 and a resistor 174, as shown. A low voltage enable signal applied to the enable input 168 is coupled to the base 166 of the transistor 160. This low voltage enable signal would be provided, for example, by activating a push-to-talk switch to key-up the transmitter. The low voltage enable signal turns on the transistor 160 so that the voltage at the collector 162 rises to approximately the voltage $V_s$ of the supply 176. Since the capacitor 172 has an initial voltage across it of zero volts, the voltage across the resistor 174 is also approximately $V_s$. This voltage signal activates the transmission gate 130 and shorts out the resistor 124, thereby providing wide bandwidth filtering of the power signal $V_p$ permitting rapid changes in the value of the filtered power signal $V'_p$. Thus, the transmitter can reach maximum output power in a short period of time. As the capacitor 172 charges, the voltage across the resistor 174 decreases until the voltage reaches the turn-off voltage of the transmission gate 130. This turns off the transmission gate 130 so that the power signal $V_p$ is coupled through the resistor 124 providing narrow bandwidth filtering. The circuit remains in this state for normal operation. It can be seen then that this circuit maintains a high speed state for a period of time determined by the RC charging time constant of the timing circuit 151, and then switches to a steady state condition. The time period in the preferred embodiment is approximately 5 ms.

A resistor 178 is also coupled to the collector 162 of the transistor 160 in series with the resistor 150, as shown. As a result, when the collector voltage of the transistor 160 rises to approximately $V_s$ the resistor 178 and the resistor 150 act as a voltage divider to provide the desired reference voltage $V_{REF}$. The reference voltage $V_{REF}$ will otherwise be zero, thus keeping the transmitter output at zero whenever a low enable signal is not applied to the enable input 168. The exact value of the reference voltage $V_{REF}$ is determined by the position of the wiper 152 of the resistor 150. The reference voltage $V_{REF}$ is made adjustable in this way, permitting the output power level during normal operation to be adjustable.

From the foregoing description it can be seen that a power control circuit has been provided which allows rapid changes in transmitter output power when desired, while providing slower response and substantially eliminating undesired noise during normal operation.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed herein.

What is claimed is:

1. A power control circuit for controlling the power of a transmitter amplifier which produces an RF output varying in response to a control signal applied thereto, comprising:
   (a) sensing means, coupled to the transmitter amplifier, for sensing RF power, and for generating a power signal representative of RF power;
   (b) signal processing means, coupled to the sensing means, for filtering the power signal, such that wide bandwidth filtering is utilized in response to a desired change in transmitter amplifier power for a period of time sufficient to permit the desired change in transmitter amplifier power, and such that narrow bandwidth filtering is otherwise utilized;
   (c) comparator means, coupled to the signal processing means, for generating a control signal which varies in accordance with the difference between a reference voltage and the filtered power signal, said comparator means being coupled to the transmitter amplifier for applying said control signal thereto to vary the RF power developed by the transmitter amplifier.

2. The power control circuit of claim 1 wherein the signal processing means further comprises:
   timing means, for maintaining wide bandwidth filtering for a predetermined period of time in response to a desired change in transmitter amplifier power.

3. The power control circuit of claims 1, or 2 further comprising reference means for generating an adjustable reference voltage.

4. The power control circuit of claim 1 wherein the signal processing means further comprises;
   first filter means, for filtering the power signal, having a relatively narrow bandwidth, and coupled to the sensing means,
   second filter means, for filtering the power signal, having a relatively wide bandwidth, and coupled to the sensing means,
   switching means, coupled to the first and second filtering means and the comparator means, for coupling the power signal through the second filtering means to permit abrupt changes in transmitter amplifier power and for coupling the power signal through the first filter means for normal operation.

5. The power control circuit of claim 4 wherein the signal processing means further comprises:
   timing means, coupled to the switching means, for controlling the switching means, such that the power signal is coupled through the second filtering means for a predetermined period of time to permit abrupt changes in transmitter amplifier power.

6. The power control circuit of claims 4 or 5 further comprising reference means for generating an adjustable reference voltage.

7. The power control circuit of claim 6, wherein the reference means is coupled to the timing means such that the reference means is activated to key-up the transmitter.

8. The power control circuit of claims 2 or 5 wherein the timing circuit comprises a transistor and a resistor-capacitor network.

9. Method of controlling the power of a transmitter amplifier comprising the steps of:
   (a) sensing power output from the transmitter and generating a power signal representative of the power output;
   (b) filtering the power signal utilizing wide bandwidth filtering in response to a desired change in the transmitter amplifier power for a period of time sufficient to permit the desired change in transmitter power, and otherwise utilizing narrow bandwidth filtering;
   (c) generating a control signal which varies in accordance with the difference between a reference voltage and the filtered power signal;
   (d) applying said control signal to the transmitter amplifier to control the power developed by the transmitter amplifier.

10. The method of claim 9 wherein step (b) further comprises maintaining wide bandwidth filtering for a predetermined period of time in response to a desired change in transmitter amplifier power.

11. The method of claim 9 wherein step (b) further comprises maintaining wide bandwidth filtering for a predetermined period of time to permit abrupt changes in transmitter amplifier power.

* * * * *